United States Patent
Tsugimoto

(10) Patent No.: US 10,029,542 B2
(45) Date of Patent: Jul. 24, 2018

(54) CONDUCTIVE PASTE AND GLASS ARTICLE

(71) Applicant: Murata Manufacturing Co., Ltd., Nagaokakyo-shi, Kyoto-fu (JP)

(72) Inventor: Shinichi Tsugimoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/480,641

(22) Filed: Apr. 6, 2017

(65) Prior Publication Data

US 2017/0210207 A1    Jul. 27, 2017

Related U.S. Application Data

(63) Continuation of application No. PCT/JP2015/078482, filed on Oct. 7, 2015.

(30) Foreign Application Priority Data

Nov. 6, 2014 (JP) ................. 2014-225995

(51) Int. Cl.
  *B32B 3/00* (2006.01)
  *B60J 1/00* (2006.01)
  (Continued)

(52) U.S. Cl.
  CPC ............. *B60J 1/002* (2013.01); *B22F 1/0014* (2013.01); *C03C 8/18* (2013.01); *C03C 17/06* (2013.01);
  (Continued)

(58) Field of Classification Search
  CPC .......... B60J 1/002; B22F 1/0014; C03C 8/18; C03C 17/06; C09D 5/24; H01B 1/22; H05K 1/0306; H05K 1/092
  See application file for complete search history.

(56) References Cited

U.S. PATENT DOCUMENTS

| 6,866,800 B2 | 3/2005 | Adachi |
| 2003/0201426 A1 | 10/2003 | Adachi |
| 2014/0306167 A1 | 10/2014 | Terao et al. |

FOREIGN PATENT DOCUMENTS

| JP | H11-185528 A | 7/1999 |
| JP | 2000-048645 A | 2/2000 |

(Continued)

OTHER PUBLICATIONS

International Search Report issued in International Application No. PCT/JP2015/078482, dated Nov. 10, 2015.

(Continued)

*Primary Examiner* — Elizabeth E Mulvaney
(74) *Attorney, Agent, or Firm* — Arent Fox LLP

(57) ABSTRACT

A conductive paste contains at least a conductive powder, glass frit, and an organic vehicle. The conductive powder is a mixed powder of an atomized powder prepared by an atomization method and a wet reduced powder prepared by a wet reduction method and the conductive powder contains the atomized powder in the range of 5 to 40 wt %. The atomized powder is 5.2 to 9 μm in average particle size and the content of a chlorine component mixed in the conductive powder is 42 ppm or less. The conductive paste is applied in the form of a line onto a glass substrate 1 and subjected to firing to form conductive films. This conductive paste can prevent glass substrates from undergoing color changes and prevent base layers for conductive films from having structural defects such as cracks.

20 Claims, 2 Drawing Sheets

(51) Int. Cl.
    *C03C 8/18*     (2006.01)
    *C09D 5/24*     (2006.01)
    *C03C 17/06*     (2006.01)
    *B22F 1/00*     (2006.01)
    *H05K 1/09*     (2006.01)
    *H05K 1/03*     (2006.01)
    *H01B 1/22*     (2006.01)

(52) U.S. Cl.
    CPC ................ *C09D 5/24* (2013.01); *H01B 1/22* (2013.01); *H05K 1/0306* (2013.01); *H05K 1/092* (2013.01); *C03C 2207/00* (2013.01)

(56) References Cited

FOREIGN PATENT DOCUMENTS

| | | |
|---|---|---|
| JP | 3767514 B2 | 4/2006 |
| JP | 4805621 B2 | 11/2011 |
| JP | 2012-079458 A | 4/2012 |
| WO | WO 2013/073607 A | 5/2013 |

OTHER PUBLICATIONS

Written Opinion of the International Searching Authority issued in International Application No. PCT/JP2015/078482, dated Nov. 10, 2015.

CONDUCTIVE PASTE AND GLASS ARTICLE

CROSS REFERENCE TO RELATED APPLICATIONS

The present application is a continuation of International application No. PCT/JP2015/078482, filed on Oct. 7, 2015, which claims priority to Japanese Patent Application No. 2014-225995, filed on Nov. 6, 2014, the entire contents of each of which are incorporated herein by reference.

TECHNICAL FIELD

The present invention relates to a conductive paste and a glass article, and more particularly, a conductive paste for forming anti-fogging hot wires, antenna patterns, and the like provided on window glass for vehicles such as automobiles, and to a glass article such as anti-fogging glass and glass antennas, obtained with the use of the conductive paste.

BACKGROUND ART

Conventionally, for window glass of vehicles such as automobiles, glass articles are used such as anti-fogging glass provided with anti-fogging hot wires and glass antennas for receiving ratio waves from the outside of vehicles. These glass articles typically have a conductive film formed in a predetermined pattern by applying a conductive paste in the form of lines onto a glass substrate and firing the paste. This type of conductive paste for glass articles has been researched and developed actively.

For example, Japanese Patent No. 3767514 (Patent Document 1) proposes therein a conductive paste including an Ag powder, glass frit, and an organic vehicle, for anti-fogging hot wires of automotive windows, where a silver powder of 4.5 µm to 7 µm in particle size and 100 nm or more in crystallite size accounts for 50 wt % or more of the Ag powder. According to this patent, the use of the conductive paste in which 50 wt % or more of the Ag powder has predetermined particle sizes and crystallite sizes retards sintering of the Ag particles, thereby attempting to achieve anti-fogging hot wires which have favorable solder wettability, keep the joint strength from being decreased, and have a high resistivity suitable for automotive window glass.

In addition, Japanese Patent No. 4805621 (Patent Document 2) proposes a conductive paste including a first Ag powder of 5 µm or less in average particle size, obtained by an atomization preparation method and a second Ag powder within the range of 0.2 to 2.0 µm in average particle size, obtained by a wet reduction method, in proportions by mass within the range of 20/80≤(first Ag powder/second Ag powder)≤80/20, where the second Ag powder includes a fine powder within the range of 1.0 to 2.0 µm in average particle size, and an ultra-fine powder within the range of 0.2 to 0.6 µm in average particle size. According to this patent, the blend of the atomized powder having the predetermined particle sizes and the wet reduced powder having the predetermined particle sizes in the predetermined proportions by mass attempts to achieve a conductive paste which suppresses firing shrinkage, and has a low resistance value after firing.

Conventional methods for preparing conductive powders such as Ag powders used in conductive pastes include wet reduction methods and atomization methods. Further, Ag powders with relatively large particle sizes on the order of 4.5 µm to 7 µm as in Patent Document 1 are preferably prepared by the atomization methods rather than the wet reduction methods, in consideration of cost.

However, when the Ag powder according to Patent Document 1 is prepared by an atomization method, and when a conductive paste containing the atomized powder is applied in the form of a line onto a glass substrate and subjected to firing, there is a possibility that the glass substrate around the fired conductive film will undergo a color change to a yellow color or the like. When such conductive pastes are used in automotive window glass, there is a possibility that the visibility of the drivers will be adversely affected. On the other hand, when a wet reduced powder is used, there is a possibility that an increase in cost will be caused as compared with atomized powders as described above, although there is no color change to a yellow color or the like.

In addition, as automotive window glass, it is common to form, on a glass substrate, a blackish ceramic layer that has an antidazzle function, and form a conductive film on the ceramic layer in the form of a line. In this case, for the automotive window glass mentioned above, typically, a ceramic dried film is formed on the glass substrate, thereafter, a conductive paste is applied onto the ceramic dried film, and dried, and the ceramic dried film and the conductive paste are subjected to co-firing, thereby forming the ceramic layer and the conductive film.

However, while Patent Document 2 makes an attempt to suppress firing shrinkage by adjusting the combination ratio between the atomized powder of 5 µm or less in average particle size and the wet reduced powder of 0.2 to 2.0 µm in average particle size, the average particle size of 5 µm or less decreases the effect of suppressing firing shrinkage even when the low-sinterability atomized powder is used, and for this reason, ceramic layers have the possibility of having structural defects such as cracks generated after firing.

It is an object of the present invention to provide a conductive paste which can prevent a glass substrate from undergoing a color change and prevent a base layer for a conductive film from having structural defects such as cracks generated. It is also an object of the present invention to provide a glass article, such as anti-fogging glass, using the conductive paste.

For atomized powders, jet flows are sprayed to molten metals to make droplets, and the droplets are solidified, thereby providing metal powders. Therefore, as compared with wet reduced powders obtained in a way that aqueous solutions of metal salts are reduced to deposit metal powders, the surfaces can be prevented from having unevenness, and the specific surface areas can be thus reduced, thereby decreasing the sinterability.

On the other hand, as mentioned in the section of [Problem to be solved by the invention], the use of only the atomized powder as the conductive powder unfavorably causes the glass substrate near the conductive film to undergo a color change after firing.

Therefore, the inventors have earnestly carried out studies with the use of mixed powders of an atomized powder and a conductive powder other than the atomized powder, for example, a wet reduced powder, thereby finding that because of minute amounts of chlorine components included in molten metal and spray water in the process of producing the atomized powder, the chlorine components are mixed as impurities into the conductive powder, and for this reason, the glass substrate near the conductive film undergoes a color change after firing.

Further, the inventors have earnestly carried out further studies, thereby providing the finding that as long as the content of the chlorine component mixed in the conductive powder is 42 ppm or less, the conductive powder contains therein a predetermined amount of atomized powder with an average particle size adjusted within a predetermined range, thereby making it possible to prevent the glass substrate from undergoing a color change, and a base layer for the conductive film from having structural defects such as cracks generated.

The present invention has been made on the basis of the foregoing finding, and a conductive paste according to the present invention is a conductive paste containing at least a conductive powder, glass frit, and an organic vehicle, in which the conductive powder contains an atomized powder in a range of 5 to 40 wt %, the atomized powder is 5.2 to 9 µm in average particle size, and a content of a chlorine component mixed in the conductive powder is 42 ppm or less.

It is to be noted that average particle size mentioned above is referred to as a particle size corresponding to 50% of the cumulative distribution, that is, a median size (hereinafter, an "average particle size $D_{50}$") in the present invention.

In addition, in the conductive paste according to the present invention, the conductive powder preferably contains a wet reduced powder.

The mixed powder of the atomized powder and the wet reduced powder is adopted for the conductive powder as just described, thereby making it possible to achieve, in an effective manner, a conductive paste which undergoes no color change to a yellow color or the like after firing.

In addition, in the conductive paste according to the present invention, a content of the conductive powder is preferably 50 to 90 wt %.

Furthermore, in the conductive paste according to the present invention, an average particle size of the glass frit is preferably twice or less as large as an average particle size of the conductive powder.

In addition, in the conductive paste according to the present invention, the glass frit preferably has a softening point of 350° C. to 600° C.

In addition, in the conductive paste according to the present invention, the conductive powder preferably contains Ag as a main constituent.

In addition, a glass article according to the present invention is a glass article including a conductive film in a predetermined pattern formed on a glass substrate, in which the conductive film is obtained by applying the conductive paste according to any of the foregoing onto the glass substrate, and making the paste sintered.

In addition, it is preferable that, in the glass article according to the present invention, a ceramic layer is formed on a surface of the glass substrate, and the conductive film is at least partially formed on a surface of the ceramic layer.

Advantageous Effect of the Invention

The conductive paste according to the present invention is a conductive paste containing at least a conductive powder, glass frit, and an organic vehicle, where the conductive powder contains an atomized powder in a range of 5 to 40 wt %, the atomized powder is 5.2 to 9 µm in average particle size, and a content of a chlorine component mixed in the conductive powder is 42 ppm or less. Thus, even when the paste is used for automotive window glass, the amount of the chlorine component in the conductive paste can be reduced to such a degree that the glass substrate near the conductive film undergoes no significant color change, and even when a base layer is formed from a ceramic layer or the like, the sinterability can be reduced such a degree that the base layer has no structural defects such as cracks generated.

In addition, the glass article according to the present invention is a glass article with a conductive film in a predetermined pattern formed on a glass substrate, where the conductive film is obtained by applying the conductive paste according to any of the foregoing onto the glass substrate, and making the paste sintered. Thus, a glass article such as anti-fogging glass can be achieved which can prevent the glass substrate near the conductive film from undergoing a color change to a yellow color or the like.

In addition, even when a ceramic layer is formed on the surface of the glass substrate, and when the conductive film is at least partially formed on the surface of the ceramic layer, a glass article such as anti-fogging glass can be achieved which can prevent the ceramic layer from having structural defects such as cracks generated.

DESCRIPTION OF THE PREFERRED EMBODIMENTS

The anti-fogging glass according to the first embodiment has, on the surface of a glass substrate 1, multiple conductive films 2 formed in the form of fine, thin parallel lines which are spaced at predetermined intervals, and bus bar electrodes 3a, 3b formed on both ends of the conductive films 2. The bus bar electrodes 3a, 3b are connected to feeding terminals, not shown, with solder interposed therebetween.

This anti-fogging glass can be prepared as follows. First, a conductive paste according to the present invention, as will be described later, is applied in the form of lines onto the glass substrate 1, dried, and then subjected to firing treatment. As a result, conductive films 2 are formed in a predetermined pattern and fixed on the glass substrate 1. Then, the bus bar electrodes 3a, 3b are electrically connected to respective opposite ends of the conductive films 2, and the bus bar electrodes 3a, 3b are soldered to feeding terminals (not shown), thereby preparing the anti-fogging glass according to the first embodiment.

The anti-fogging glass can be used, for example, as rear glass, mainly for vehicles such as automobiles. Power is supplied to the conductive films 2 from the feeding terminals through the bus bar electrodes 3a, 3b and allowed to generate heat, thereby making it possible to achieve anti-fogging performance.

Figure 1:
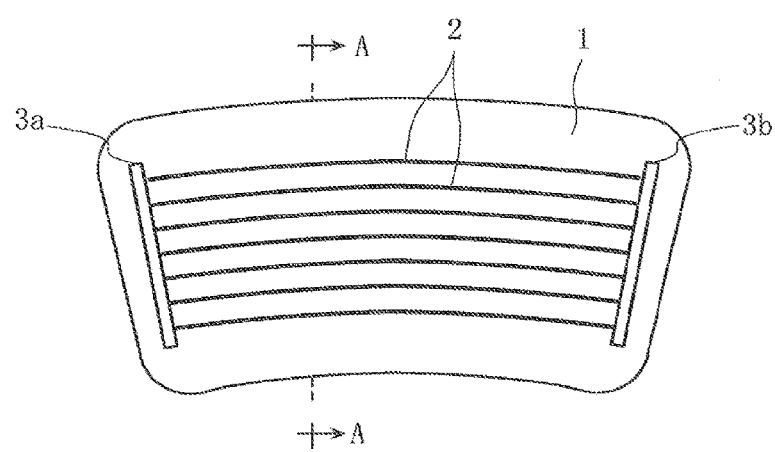
FIG. 1 is a front view illustrating an embodiment (first embodiment) of a glass article prepared with the use of a conductive paste according to the present invention.
Figure 2:
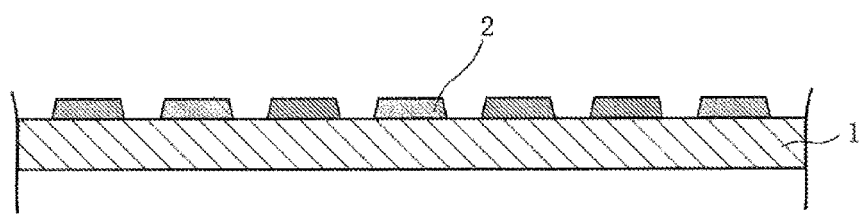
FIG. 2 is a cross-sectional view of FIG. 1 along the line A-A indicated by arrows.
Figure 3:
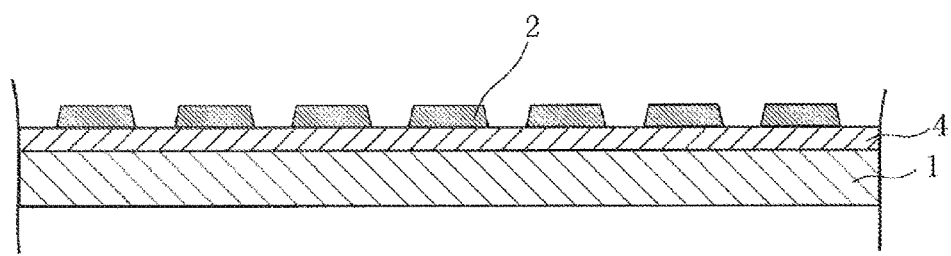
FIG. 3 is a cross-sectional view schematically illustrating a second embodiment of a glass article according to the present invention.

FIG. 3 is a main cross-sectional view illustrating a second embodiment of the anti-fogging glass. In this embodiment a ceramic layer 4 is located on the surface of a glass substrate 1 and conductive films 2 are located in a predetermined pattern on the surface of the ceramic layer 4.

This anti-fogging glass can be prepared as follows. First, a ceramic paste is prepared which contains a ceramic powder including glass frit, and an organic vehicle. The ceramic powder which includes the glass frit is not particularly limited, but powders can be selected appropriately, as required, from among ZnO, Al2O3, B2O3, SiO2, TiO2, and ZrO2, alkali metal oxides, alkaline-earth metal oxides, and the like, combined for a predetermined composition, and used. The glass frit is preferably amorphous. Amorphous glass frit is more likely to be softened and more flowable in the case of firing, and can be thus fired at relatively low temperatures. The anti-fogging glass of this embodiment is typically used in rear windows of vehicles and the like. For this reason, it is preferable to add a black pigment that has an antidazzle function to the ceramic paste.

For the organic vehicle, the same as in a conductive paste according to the present invention as will be described later can be used. Then, the ceramic powder containing the glass frit, and the organic vehicle are weighed so as to reach a predetermined mixing ratio, mixed, and dispersed and kneaded with the use of a triple roll mill or the like, thereby preparing a ceramic paste. This ceramic paste is applied onto the glass substrate 1, and dried, thereby preparing a ceramic dried film. The conductive paste according to the present invention, as will be described later, is applied in the form of a line onto the ceramic dried film, and thereafter, subjected to a firing treatment, thereby forming the conductive films 2 in a predetermined pattern on the ceramic layer 4. Thus, the conductive films 2 are fixed on the glass substrate 1 with the ceramic layer 4 interposed therebetween.

Thereafter, as with the first embodiment, bus bar electrodes 3a, 3b are electrically connected to respective opposite ends of the conductive films 2, and the bus bar electrodes 3a, 3b are soldered to feeding terminals (not shown), thereby preparing the anti-fogging glass according to the second embodiment.

This anti-fogging glass is typically provided as a front windshield of a vehicle such as an automobile and, as in the first embodiment, power is supplied to the conductive films 2 from the feeding terminals through the bus bar electrodes 3a, 3b, and allowed to generate heat, thereby making it possible to achieve anti-fogging performance. In addition, it is also possible to provide an antidazzle function by making the ceramic layer 4 blackish.

Next, the conductive paste according to the present invention for use in the first and second embodiments will be described in detail. The conductive paste preferably contains at least a conductive powder, glass frit, and an organic vehicle.

The conductive powder mentioned above contains an atomized powder in the range of 5 to 40 wt %. More specifically, the conductive powder is formed from a mixed powder of the atomized powder and a powder other than the atomized powder, and the content of the atomized powder is adapted to be 5 to 40 wt %. It is to be noted that according to the present embodiment, a wet reduced powder is used as the powder other than the atomized powder. Furthermore, the average particle size of the atomized powder is 5.2 to 8.8 µm and the content of a chlorine component in the conductive powder is adapted to be 42 ppm or less.

Thus, the glass substrate 1 can be prevented from undergoing a color change to a yellow color or the like, and anti-fogging glass can be achieved which is favorable in terms of its aesthetic aspect and visibility. In addition, the ceramic layer 4 can be prevented from having structural defects such as cracks, even when the ceramic layer 4 is interposed between the conductive film 2 and the glass substrate 1 as in the second embodiment.

Metal powders of fine particles like the conductive powder are typically prepared by a wet reduction method or an atomization method. The wet reduction method is a preparation method with the use of a chemical process, where an aqueous solution of a metal salt such as an Ag salt is reduced with a reductant to deposit a metal powder. For this reason, the particle shapes are close to spherical shapes, but the specific surface area is large because the surface has fine unevenness formed. These morphological features can promote grain growth, thereby achieving favorable sinterability.

On the other hand, the atomization method causes a flow of molten metal by heat treatment, from a nozzle at the tundish bottom, further sprays a jet flow to the molten metal to make droplets, and solidifies the droplets, thereby preparing a metal powder. Therefore, the particles have roughly awkward indefinite shapes, but their surface is smooth with reduced unevenness thereby reducing the specific surface area. These morphological features decrease the sinterability in contrast to the wet reduced powder. Furthermore, the atomization method can produce the powder in an inexpensive manner as compared with the wet reduced powder and has the advantage that there is also no need for treatment of hazardous waste generated in wet processes.

Accordingly, in order to reduce differences in shrinkage behavior when the glass substrate 1 and the ceramic layer 4 are fired (thereby avoid the generation of structural defects such as deformations of the glass substrate 1 and cracks of the ceramic layers 4), it is desirable to use a low-sinterability and inexpensive atomized powder as the conductive powder.

However, as mentioned above, the conductive powder composed of only the atomized powder has the possibility of causing the glass substrate 1 near the conductive films to undergo a color change to a yellow color or the like after firing, thereby causing disfigurement and affecting the visibility of drivers. Therefore, the inventors have earnestly carried out studies through trial and error with the use of mixed powders of atomized powders and wet reduced powders, thereby discovering that the color change of the glass substrate 1 near the conductive films results from a minute amount of chlorine component mixed as an impurity into the conductive powder.

More specifically, in the case of the atomized powder, a jet flow is sprayed to a molten metal to make droplets, and the drop lets are solidified. Thus, there is a possibility that a minute amount of chlorine component will be mixed into the molten metal. In addition, tap water or industrial water is typically used in the spray water for spraying the jet flow, but the tap water and the industrial water contain therein chlorine components. Further, when these chlorine components are mixed as impurities into the atomized powder, there is a possibility that the glass substrate 1 near the conductive film 2 will undergo a color change.

The reason for this is believed to be as follows.

In the case of using conductive powder with the chlorine components mixed therein, chlorine and metal particles such as Ag react to produce metal salts such as AgCl when the conductive paste is subjected to firing. Then, it is believed that the metal salts evaporate and fly around the conductive films 2 to adhere to the surface of the glass substrate 1. Metal ions such as Ag ions diffused from the surface of the glass substrate 1 into the interior of the grass substrate 1 are reduced to produce metal colloids such as Ag colloids at the surface layer of the glass substrate 1, and as a result, the surface of the glass substrate 1 undergoes a color change such as a yellow or the like.

Therefore, according to the present embodiment, the chlorine component mixed in the conductive powder is reduced as much as possible.

The reason for the content of the chlorine component in the conductive powder (hereinafter, referred to as a "chlorine content"), the content of the atomized power in the conductive powder, and the average particle size $D_{50}$ of the atomized powder within the ranges mentioned above will be described in detail below.

(1) Chlorine Content

A cause for the color change of the glass substrate 1 near the conductive films 2 to a yellow color is considered as the chlorine component mixed as an impurity in the conductive powder as described above. In addition, there is a possibility that the chlorine component will be also mixed in a minute amount into the wet reduced powder and there is thus a need to set not only a limit on the chlorine content in the atomized powder but also a limit on the total chlorine content in the conductive powder.

Therefore, the inventors have earnestly carried out studies through trial and error, and have discovered that the reduction of the total chlorine content in the conductive powder to 42 ppm or less can prevent the glass substrate 1 near the conductive films 2 from undergoing a color change to a yellow color. Accordingly, in the present embodiment, the chlorine content in the conductive powder is adapted to be 42 ppm or less.

It is to be noted that the method of reducing the chlorine content in the conductive powder to 42 ppm or less is not particularly limited, but for example, the chlorine content can be reduced through the use of high purity ion-exchange water or the like subjected to water treatment.

(2) Content of Atomized Powder

The atomized powder can, because of its low sinterability as compared with the wet reduced powder, suppress firing shrinkage of the conductive films 2 and thus prevent the ceramic layer 4 as a base layer for the conductive films 2 from having structural defects such as cracks. Further, the atomized powder must be at least 5 wt % or more in the conductive powder.

On the other hand, if the content of the atomized powder in the conductive powder exceeds 40 wt %, the absolute value of the chlorine content in the conductive powder is also increased and the glass substrate 1 near the conductive films 2 thus undergoes a significant color change to a yellow color or the like.

Thus, according to the present embodiment, the content of the atomized powder in the conductive powder is adapted to be 5 to 40 wt %.

(3) Average Particle Size $D_{50}$ of Atomized Powder

The atomized powder suppresses firing shrinkage of the conductive films 2 as described above, thereby making it possible to prevent structural defects in the ceramic layer 4. However, if the average particle size $D_{50}$ of the atomized powder is less than 5.2 µm, the particle sizes result in excessively fine particles and it becomes difficult to adequately suppress firing shrinkage, even when the low-sinterability atomized powder is used.

On the other hand, the conductive films 2 are typically prepared by a screen printing method, but the average particle size $D_{50}$ of the atomized powder in excess of 9 µm unfavorably makes the mesh of the screen printing plate more likely to be clogged.

Thus, according to the present embodiment, the atomized powder in the conductive powder is preferably adapted to be 5.2 to 9 µm in average particle size $D_{50}$. It is to be noted that the average particle size $D_{50}$ of the conductive powder as a mixed powder in excess of 9 µm makes clogging more likely to be caused and the average particle size $D_{50}$ of the overall conductive powder is thus also preferably 9 µm or less.

The conductive powder is not particularly limited, as long as the powder is a metal powder with favorable conductivity, but typically, an Ag powder is preferably used. In addition, the conductive powder may contain therein an Ag powder as a main constituent and also may contain various types of conductive powders such as a Pd powder and a Pt powder as accessory constituents. In addition, the shape of the conductive powder is also not particularly limited, but may be, for example, spherical, flattened, amorphous, or the powder may be a mixed powder in these shapes.

The content of the conductive powder in the conductive paste is also not particularly limited, but preferably 50 to 90 wt %. If the content of the conductive powder is less than 50 wt %, a screen printing plate with a mesh having a large wire diameter must be used for screen printing in order to obtain the conductive films 2 of standard thick films of 3 to 20 µm and there is a possibility of causing a decrease in resolution. On the other hand, if the content of the conductive powder exceeds 90 wt %, the excessive conductive powder has the possibility of making it difficult to be made into a paste form. Therefore, the content of the conductive powder is not particularly limited, but is preferably 50 to 90 wt %.

In addition, the composition of the glass frit is not particularly limited, but there is a need to melt the glass frit at the firing temperature, thereby causing the glass frit to flow, from the perspective of avoiding a decrease in sintered density and insufficient sealing at the interfaces of the conductive films 2. Further, for glass articles such as anti-fogging glass, it is preferable to use glass frit that has composition adjusted so that the softening point is approximately 350 to 600° C. because typical firing temperature is approximately 500 to 800° C. In addition, the constituents of the glass frit are not particularly limited, but can be selected from various types of oxides such as $Bi_2O_3$, PbO, $SiO_2$, $B_2O_3$, $Al_2O_3$, BaO, CaO, SrO, ZnO, $Na_2O$, $K_2O$, $Li_2O$, $Sb_2O_3$, FeO, and CuO, in consideration of softening point and chemical durability.

The average particle size $D_{50}$ of the glass frit is also not particularly limited. However, it is desirable to fill voids between the conductive powder and the glass substrate 1 uniformly with the glass frit. To this end, the average particle size $D_{50}$ of the glass frit is desirably no more than twice the size of the average particle size $D_{50}$ of the conductive powder.

In addition, the organic vehicle is prepared so that a binder resin and an organic solvent are, for example, 1 to 3:7 to 9 in volume ratio. It is to be noted that the binder resin is not particularly limited, but for example, an ethyl cellulose resin, a nitrocellulose resin, an acrylic resin, an alkyd resin, or a combination thereof can be used as the binder resin. In addition, the organic solvent is also not particularly limited, but α-terpineol, xylene, toluene, diethylene glycol monobutylether, diethylene glycol monobutylether acetate, diethylene glycol monoethylether, diethylene glycol monoethylether acetate, and the like can be used either alone or in combination.

Further, this conductive paste can be easily manufactured by weighing the atomized powder and the wet reduced powder such that the content of the atomized powder in the conductive powder and the chlorine content in the conductive powder are respectively 5 to 40 wt % and 42 ppm or less, and further weighing and mixing the glass frit and the organic vehicle so as to reach predetermined mixing ratio, and dispersing and kneading the mixture with the use of a triple roll mill or the like.

According to this embodiment, the conductive paste contains at least the conductive powder, the glass frit and the organic vehicle. The conductive powder contains the atomized powder in the range of 5 to 40 at %. The atomized powder is 5.2 to 9 µm in average particle size, and the content of chlorine component mixed in the conductive powder is 42 ppm or less. Thus, even when the paste is used for automotive window glass, the amount of the chlorine component in the conductive paste can be reduced to such a degree that the glass substrate 1 near the conductive films 2 undergoes no visible color change and the sinterability can be reduced to such a degree that the ceramic layers 4 have no structural defects such as cracks.

It is to be noted that the present invention is not limited to the embodiments described above. For example, while the conductive powder is the mixed powder of the atomized powder and the wet reduced powder according to the embodiments mentioned above, the conductive powder that the paste contains therein along with the atomized powder is not limited to the wet reduced powder, but may be powders prepared by other methods.

In addition, while the conductive films 2 are formed on the surface of the ceramic layer 4 according to the second embodiment mentioned above, the conductive films 2 may be formed partially on the ceramic layer 4, if necessary.

In addition, while the anti-fogging glass is exemplified as a glass article in the first and second embodiments mentioned above, the present invention is not limited to the anti-fogging glass, but obviously, can be also applied to other glass articles such as glass antennas.

In addition, according to the present invention, the conductive paste may contain therein various types of inorganic constituents, if necessary, to the extent that characteristics are not affected. The conductive paste may contain, for example, Zr, P, V, Ce, Nb, Ta, W, Pd, Ag, Ru, Sn, In, Y, Dy, La, and the like. In addition, the containing form is also not particularly limited, but can be selected appropriately from oxides, hydroxides, peroxides, halides, carbonates, nitrates, phosphates, sulfates, fluorides, organometallic compounds, and the like.

In addition, it is also preferable to add, to the present conductive paste, one of plasticizers such as phthalic acid di 2-ethylhexyl and dibutyl phthalate, or a combination thereof, if necessary. In addition, it is also preferable to add a rheology modifier such as a fatty acid amide or a fatty acid, and a thixotropic agent, a thickener, a dispersant, and the like may be further added.

Next, an example of the present invention will be specifically described.

EXAMPLE

[Preparation of Sample]

Six types of Ag powders (powder samples A to F) with average particle sizes $D_{50}$ and chlorine contents as shown in Table 1 were prepared, and Bi—B—Si—O based glass frit of 2 μm in average particle size $D_{50}$ were prepared.

The powder sample A was prepared by a wet reduction method, whereas the powder samples B to F were prepared by an atomization method. For the powder samples A to F, the average particle sizes $D_{50}$ were measured with the use of a laser diffraction-type particle size distribution measurement device (9320HRA from MicrotracBEL Corp.). In addition, the chlorine contents in the respective powder samples were measured with the use of an ion-chromatograph measurement device (ICS-5000 from DIONEX).

TABLE 1

| Powder Sample | Average Particle Size $D_{50}$ (μm) | Chlorine Content (ppm) | Preparation Method |
|---|---|---|---|
| A | 0.9 | 8 | Wet Reduction Method |
| B* | 3.0 | 170 | Atomization Method |
| C* | 4.5 | 115 | Atomization Method |
| D | 5.2 | 100 | Atomization Method |
| E | 5.4 | 180 | Atomization Method |
| F | 8.8 | 60 | Atomization Method |

*outside the scope of the present invention

Then, an organic vehicle was prepared as follows. An ethyl cellulose resin and terpineol were mixed so that the ethyl cellulose resin was 10 wt % as a binder resin. The terpineol was 90 wt % and was used as an organic solvent, thereby preparing the organic vehicle.

Next, the blending proportions of the atomized powder and wet reduced powder were adjusted such that the content ratio of the atomized powder in the Ag powder was achieved as shown in Table 2 in ratio by weight, and the Ag powder, the glass frit, and the organic vehicle were further blended such that the total content of the Ag powder was 78 wt %, the content of the glass frit was 4 wt %, and the rest was the organic vehicle, mixed with a planetary mixer, and then dispersed and kneaded with a triple roll mill, thereby preparing conductive pastes of sample numbers 1 to 14.

[Evaluations of Samples]

A glass slide composed of soda lime and a black ceramic paste was prepared. The dimensions of the glass slide were length: 76 mm, width: 26 mm, and thickness: 1.4 mm. Then, the ceramic paste was applied to a region of about ½ the whole glass slide with the use of a screen printing method. The ceramic paste was dried for 10 minutes at a temperature of 150° C., thereby preparing a ceramic dried film.

Next, screen printing was applied so as to achieve total line length L: 100 mm and line width W: 0.5 mm, thereby forming a conductive pattern on the glass slide or the ceramic dried film. Then, the glass slide was dried for 10 minutes at a temperature of 150° C. and then subjected to firing for 5 minutes at a maximum temperature of 600° C., thereby providing samples of sample numbers 1 to 14 with conductive films formed on the surfaces.

Next, whether or not there was a color change to a yellow color or the like near the conductive films formed directly on the surfaces of the glass slides was observed visually and samples with minor and unnoticeable color changes were regarded as pass (○), whereas samples with significant color changes were regarded as fail (×). In addition, peripheral edges of the conductive films formed on the surfaces of the ceramic layers were observed with a microscope and samples with uncracked ceramic layers were regarded as pass (○), whereas samples with the cracked ceramic layers were regarded as fail (×).

Table 2 shows the types of the atomized powders used for sample numbers 1 to 14, the content ratios of the atomized powders in the Ag powders, the chlorine contents therein, the presence or absence of color changes and cracks.

It is to be noted that the wet reduced powder of sample number A is used for the Ag powders other than the atomized powders in Table 2.

TABLE 2

| Sample No. | Atomized Powder | Blending Ratio of Atomized Powder (wt %) | Chlorine Content (ppm) | Color Changed or Not | Ceramic Layer Cracked or Not |
|---|---|---|---|---|---|
| 1* | — | 0 | 8 | ○ | x |
| 2* | B | 20 | 40 | ○ | x |
| 3* | C | 20 | 29 | ○ | x |
| 4 | D | 20 | 26 | ○ | ○ |
| 5 | E | 20 | 42 | ○ | ○ |
| 6 | F | 20 | 18 | ○ | ○ |
| 7* | B | 40 | 51 | x | x |
| 8 | D | 5 | 13 | ○ | ○ |
| 9 | D | 10 | 17 | ○ | ○ |
| 10 | D | 30 | 36 | ○ | ○ |
| 11* | D | 40 | 45 | x | ○ |
| 12* | D | 50 | 54 | x | ○ |
| 13 | F | 5 | 11 | ○ | ○ |
| 14 | F | 40 | 29 | ○ | ○ |

*outside the scope of the present invention

As for sample number 1, it was confirmed that the glass slide near the conductive film has no noticeable color change but the ceramic layer was cracked. It is believed that this occurred because the Ag powder was formed from only the wet reduced powder without containing therein the atomized powder which would have the effect of suppressing firing shrinkage. As a result, firing shrinkage is promoted and the ceramic layer cracks due to a difference in shrinkage behavior between the Ag powder and the ceramic layer when fired.

Also as for sample numbers 2 and 3, it was confirmed that the glass slides near the conductive films have no noticeable color changes, but the ceramic layers were again cracked. It is believed, that this occurred because the chlorine content in the Ag powder is from 29 to 40 ppm (i.e., less than 42 ppm) so that no color change is caused. However, the powder samples B, C have atomized powders having an average powder size $D_{50}$ of 3.0 μm and 4.5 μm, both less than 5.2 μm in average particle size $D_{50}$, so that the Ag powder has an insufficient effect of suppressing firing shrinkage. As a result, the ceramic layer cracked due to a difference in shrinkage behavior between the Ag powder and the ceramic layer in the case of firing, as with the sample number 1.

As for sample number 7, it was confirmed that the glass slide near the conductive film had a significant color change, and moreover, the ceramic layer was cracked. It is believed that this occurred because the chlorine content was as high as 51 ppm causing a color change to occur and, since the powder sample B used an atomized powder having average particle size $D_{50}$ of 3.0 μm, the effect of suppressing firing shrinkage was not sufficiently produced and for this reason, the ceramic layer cracked.

As for sample numbers 11 and 12, significant color changes were confirmed because of the high chlorine contents of 45 ppm and 54 ppm, although the ceramic layers were not cracked.

In contrast, sample numbers 4 to 6, 8 to 10, 13, and 14 contain the atomized powders of the powder samples D to F of 5.2 μm and 8.8 μm in average particle size $D_{50}$ in the range of 5 to 40 wt %, and have chlorine contents of 11 to 42 ppm, which meet the requirement of 42 ppm or less, all within the scope of the present invention. Thus, it was confirmed that practically strong anti-fogging glass is achieved where glass slides undergo minor and unnoticeable color change while ceramic layers as bases have no cracks generated.

The invention claimed is:

1. A conductive paste comprising at least a conductive powder, glass frit, and an organic vehicle, wherein:
    the conductive powder contains both an atomized powder in a range of 5 to 40 wt % of the conductive paste and a wet reduced powder, a content of a chlorine component mixed in the conductive powder being no more than 42 ppm; and
    the atomized powder is 5.2 to 9μm in average particle size.

2. The conductive paste according to claim 1, wherein a content of the conductive powder is 50 to 90 wt % of the conductive paste.

3. The conductive paste according to claim 2, wherein an average particle size of the glass frit is no more than twice an average particle size of the conductive powder.

4. The conductive paste according to claim 3, wherein the glass frit has a softening point of 350° C. to 600° C.

5. The conductive paste according to claim 3, wherein the conductive powder contains Ag as a main constituent.

6. The conductive paste according to claim 1, wherein a content of the conductive powder is 50 to 90 wt % of the conductive paste.

7. The conductive paste according to claim 1, wherein an average particle size of the glass frit is no more than twice an average particle size of the conductive powder.

8. The conductive paste according to claim 1, wherein the glass frit has a softening point of 350° C. to 600° C.

9. The conductive paste according to claim 1, wherein the conductive powder contains Ag as a main constituent.

10. A glass article comprising a glass substrate having a conductive film formed in a predetermined pattern, the conductive film being formed by sintering a conductive paste on the glass substrate, the conductive paste comprising at least a conductive powder, glass frit, and an organic vehicle, wherein:
    the conductive powder contains an atomized powder in a range of 5 to 40 wt% of the conductive paste, a content of a chlorine component mixed in the conductive powder is no more than 42 ppm; and
    the atomized powder is 5.2 to 9 μm in average particle size.

11. The glass article according to claim 10, wherein a ceramic layer is formed on a surface of the glass substrate and the conductive film is at least partially formed on a surface of the ceramic layer.

12. The glass article according to claim 10, wherein the conductive powder contains a wet reduced powder.

13. The glass article according to claim 10, wherein a content of the conductive powder is 50 to 90 wt % of the conductive paste.

14. The glass article according to claim 10, wherein an average particle size of the glass frit is no more than twice an average particle size of the conductive powder.

15. The glass article according to claim 10, wherein the glass frit has a softening point of 350° C. to 600° C.

16. The glass article according to claim 10, wherein the conductive powder contains Ag as a main constituent.

17. The glass article according to claim 10, wherein a content of the conductive powder is 50 to 90 wt % of the conductive paste.

18. The glass article according to claim 10, wherein an average particle size of the glass frit is no more than twice an average particle size of the conductive powder.

19. The glass article according to claim 10, wherein the glass frit has a softening point of 350° C. to 600° C.

20. The glass article according to claim 10, wherein the conductive powder contains Ag as a main constituent.

* * * * *